(12) United States Patent
Sano et al.

(10) Patent No.: US 8,993,985 B2
(45) Date of Patent: Mar. 31, 2015

(54) DRAWING APPARATUS AND METHOD OF MANUFACTURING ARTICLE

(71) Applicant: Canon Kabushiki Kaisha, Tokyo (JP)

(72) Inventors: Kentaro Sano, Utsunomiya (JP); Go Tsuchiya, Tochigi (JP)

(73) Assignee: Canon Kabushiki Kaisha (JP)

( * ) Notice: Subject to any disclaimer, the term of this patent is extended or adjusted under 35 U.S.C. 154(b) by 0 days.

(21) Appl. No.: 14/102,545

(22) Filed: Dec. 11, 2013

(65) Prior Publication Data

US 2014/0158903 A1 Jun. 12, 2014

(30) Foreign Application Priority Data

Dec. 11, 2012 (JP) .................................. 2012-270701

(51) Int. Cl.
*H01J 37/317* (2006.01)
*H01J 37/30* (2006.01)
*H01J 37/147* (2006.01)

(52) U.S. Cl.
CPC .................................. *H01J 37/147* (2013.01)
USPC .................. 250/492.22; 250/396 R; 250/398; 250/492.2; 250/492.23; 250/492.3

(58) Field of Classification Search
CPC .............. H01J 37/3177; H01J 37/3174; H01J 37/3023; H01J 2237/0435
USPC .............. 250/492.2, 398, 492.22, 492.3, 310, 250/396 ML, 492.1, 492.23, 396 R, 397, 250/491.1, 492.21, 493.1
See application file for complete search history.

(56) References Cited

U.S. PATENT DOCUMENTS

| 5,719,402 | A | * | 2/1998 | Satoh et al. ................ 250/396 R |
| 5,977,548 | A | * | 11/1999 | Oae et al. ........................ 250/397 |
| 6,114,708 | A | * | 9/2000 | Kojima et al. ............ 250/492.23 |
| 6,274,877 | B1 | * | 8/2001 | Muraki ..................... 250/492.23 |
| 6,486,479 | B1 | * | 11/2002 | Oae et al. .................... 250/492.2 |
| 6,646,275 | B2 | * | 11/2003 | Oae et al. .................... 250/492.2 |
| 6,731,320 | B1 | * | 5/2004 | Allen et al. .................... 347/233 |
| 6,787,780 | B2 | * | 9/2004 | Hamaguchi et al. .......... 250/398 |
| 6,870,171 | B2 | * | 3/2005 | Hosoda et al. ............ 250/492.22 |
| 7,084,411 | B2 | * | 8/2006 | Lammer-Pachlinger et al. .......................... 250/492.1 |
| 7,253,417 | B2 | * | 8/2007 | Frosien et al. ............ 250/396 R |
| 7,332,730 | B2 | * | 2/2008 | Heinitz et al. ............. 250/491.1 |

(Continued)

FOREIGN PATENT DOCUMENTS

| JP | 2009-032691 A | 2/2009 |
| JP | 2010-041055 A | 2/2010 |

*Primary Examiner* — Michael Logie

(74) *Attorney, Agent, or Firm* — Rossi, Kimms & McDowell LLP

(57) ABSTRACT

The present invention provides a drawing apparatus which performs drawing on a substrate with a plurality of charged particle beams, including an aperture array configured to include a plurality of apertures for shaping the respective charged particle beams, a deflection unit configured to include a plurality of first deflectors which are arranged on a side, with respect to the aperture array, of a charged particle source for radiating a charged particle beam and which deflect the respective charged particle beams, and to individually change irradiated positions of the respective charged particle beams on the aperture array by driving the respective first deflectors, and a controller configured to control deflection of the charged particle beams by the first deflectors to reduce a dispersion of intensities of the respective charged particle beams on the substrate.

16 Claims, 11 Drawing Sheets

(56) References Cited

U.S. PATENT DOCUMENTS

| | | | |
|---|---|---|---|
| 7,368,738 B2* | 5/2008 | Platzgummer | 250/492.23 |
| 7,795,597 B2* | 9/2010 | Nagae et al. | 250/396 R |
| 8,026,495 B2* | 9/2011 | Platzgummer | 250/492.22 |
| 8,143,588 B2* | 3/2012 | Nagae et al. | 250/396 R |
| 8,183,543 B2 | 5/2012 | Platzgummer | |
| 8,258,488 B2 | 9/2012 | Platzgummer et al. | |
| 2002/0008207 A1* | 1/2002 | Muraki et al. | 250/398 |
| 2003/0025088 A1* | 2/2003 | Oae et al. | 250/492.23 |
| 2003/0189180 A1* | 10/2003 | Hamaguchi et al. | 250/492.3 |
| 2005/0161620 A1* | 7/2005 | Nakasugi | 250/492.22 |
| 2006/0169910 A1* | 8/2006 | Frosien et al. | 250/396 ML |
| 2009/0114818 A1* | 5/2009 | Casares et al. | 250/307 |
| 2010/0038554 A1* | 2/2010 | Platzgummer et al. | 250/397 |
| 2012/0015303 A1* | 1/2012 | Hirata et al. | 430/296 |
| 2012/0295203 A1* | 11/2012 | Sano | 430/296 |
| 2013/0017476 A1* | 1/2013 | Ogawa | 430/30 |
| 2013/0112891 A1* | 5/2013 | Kato | 250/396 R |
| 2013/0252172 A1* | 9/2013 | Matsumoto | 430/296 |

* cited by examiner

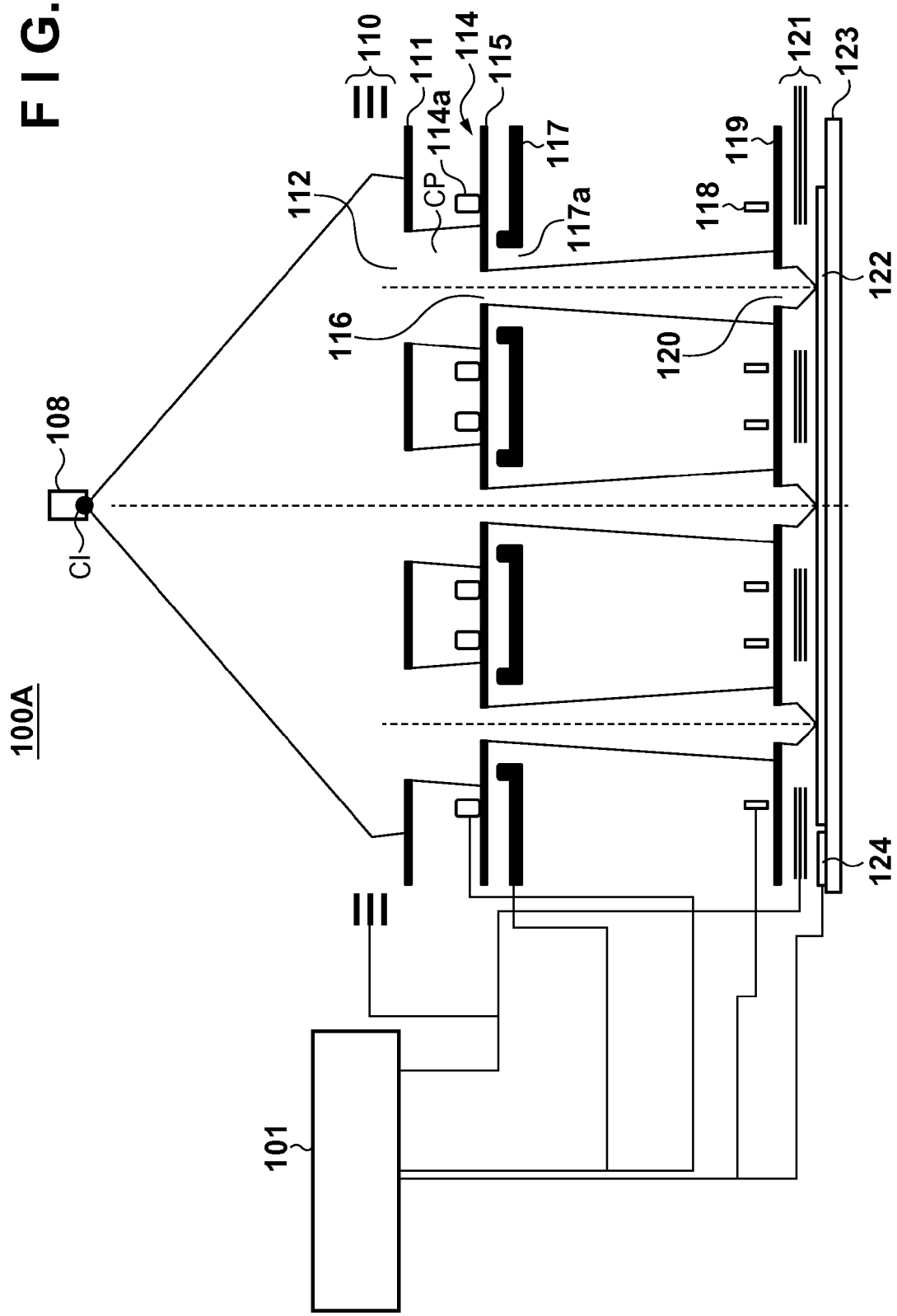

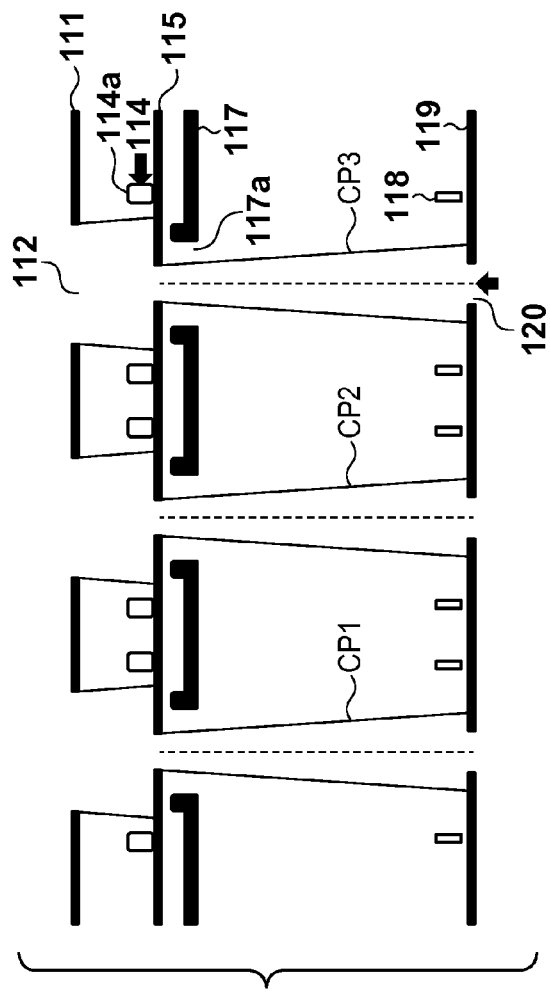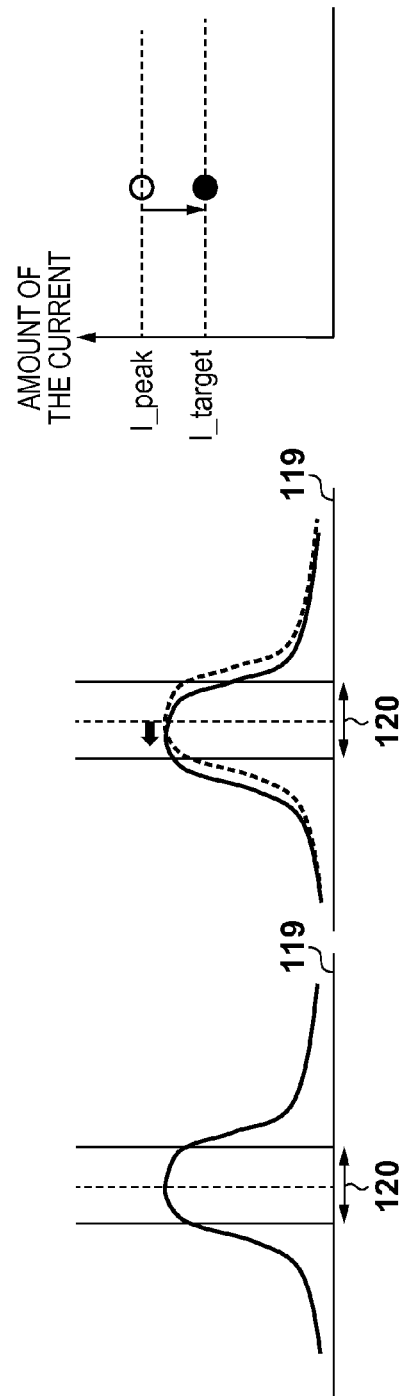
FIG. 2A
FIG. 2B
FIG. 2C
FIG. 2D

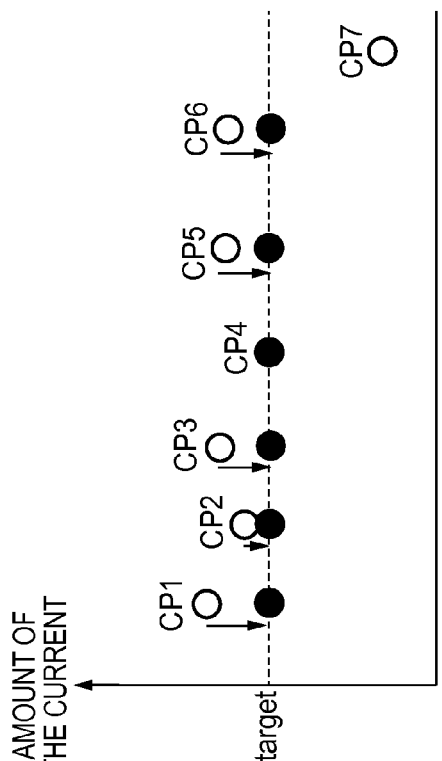
FIG. 3B
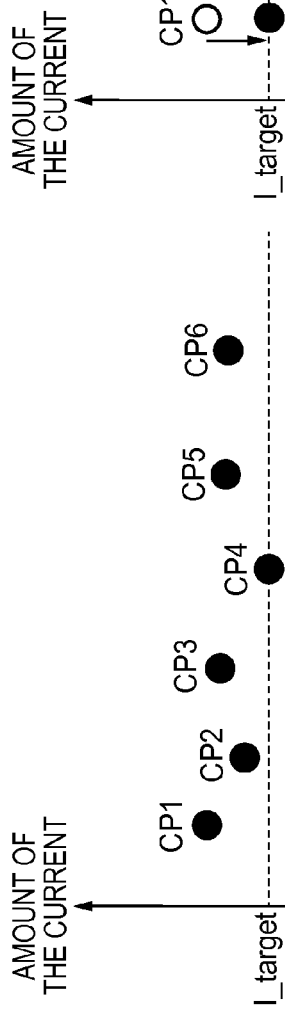
FIG. 3A
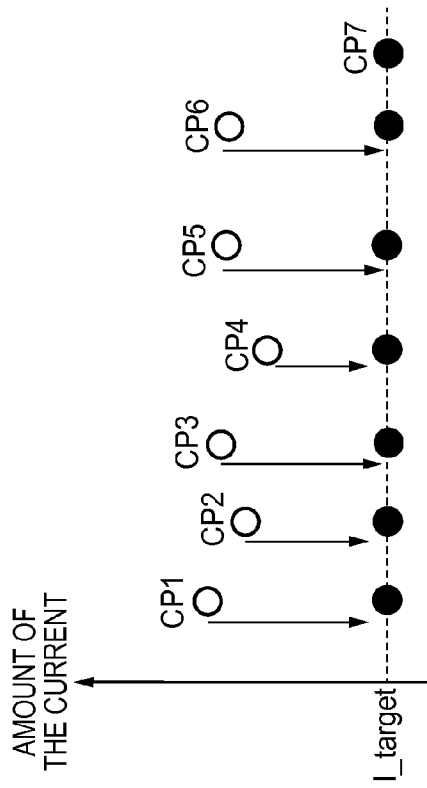
FIG. 3C
FIG. 3D
|  | initial pA | case1 pA | case2 pA |
|---|---|---|---|
| CP1 | 520 | 500 | 300 |
| CP2 | 514 | 500 | 300 |
| CP3 | 518 | 500 | 300 |
| CP4 | 500 | 500 | 300 |
| CP5 | 512 | 500 | 300 |
| CP6 | 511 | 500 | 300 |
| CP7 | 300 | 0 | 300 |
| TOTAL AMOUNT OF THE CURRENT | 3375 | 3000 | 2100 |

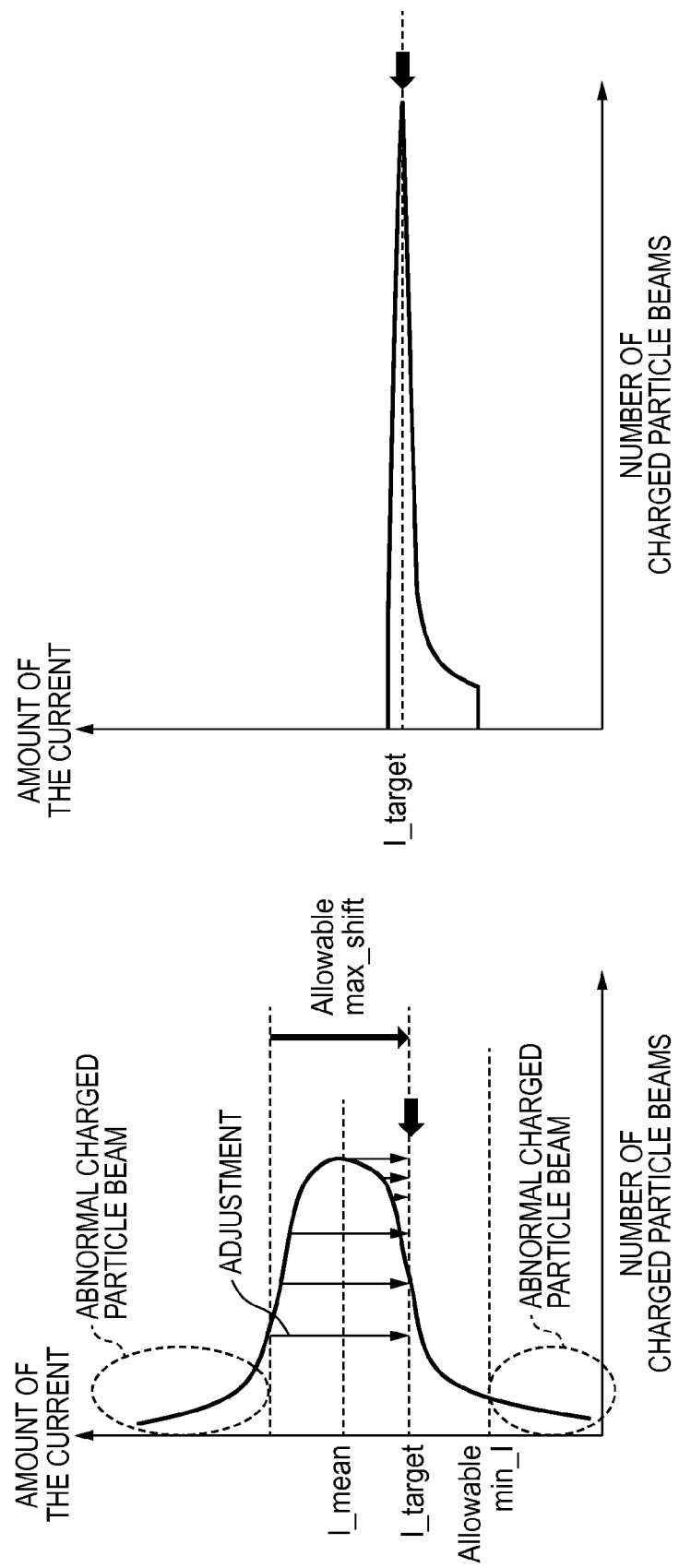

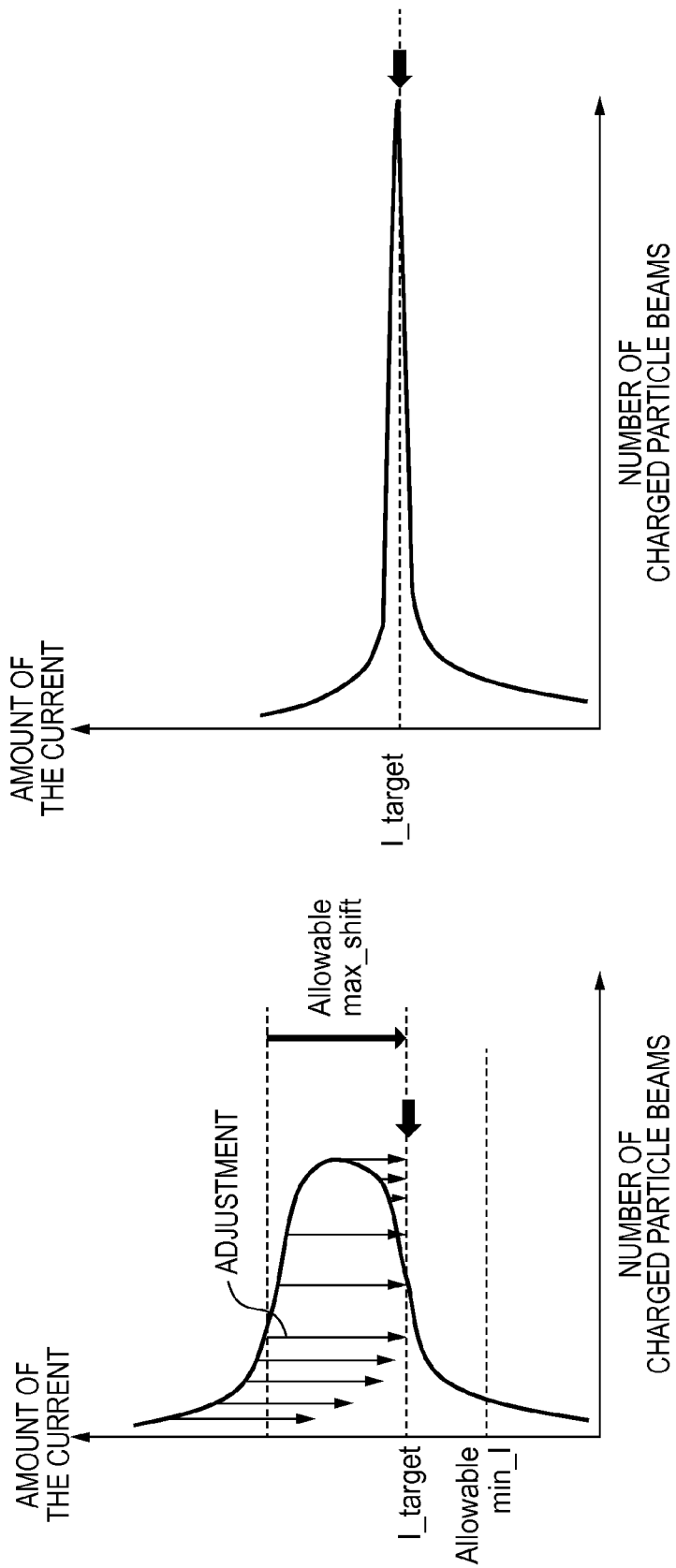

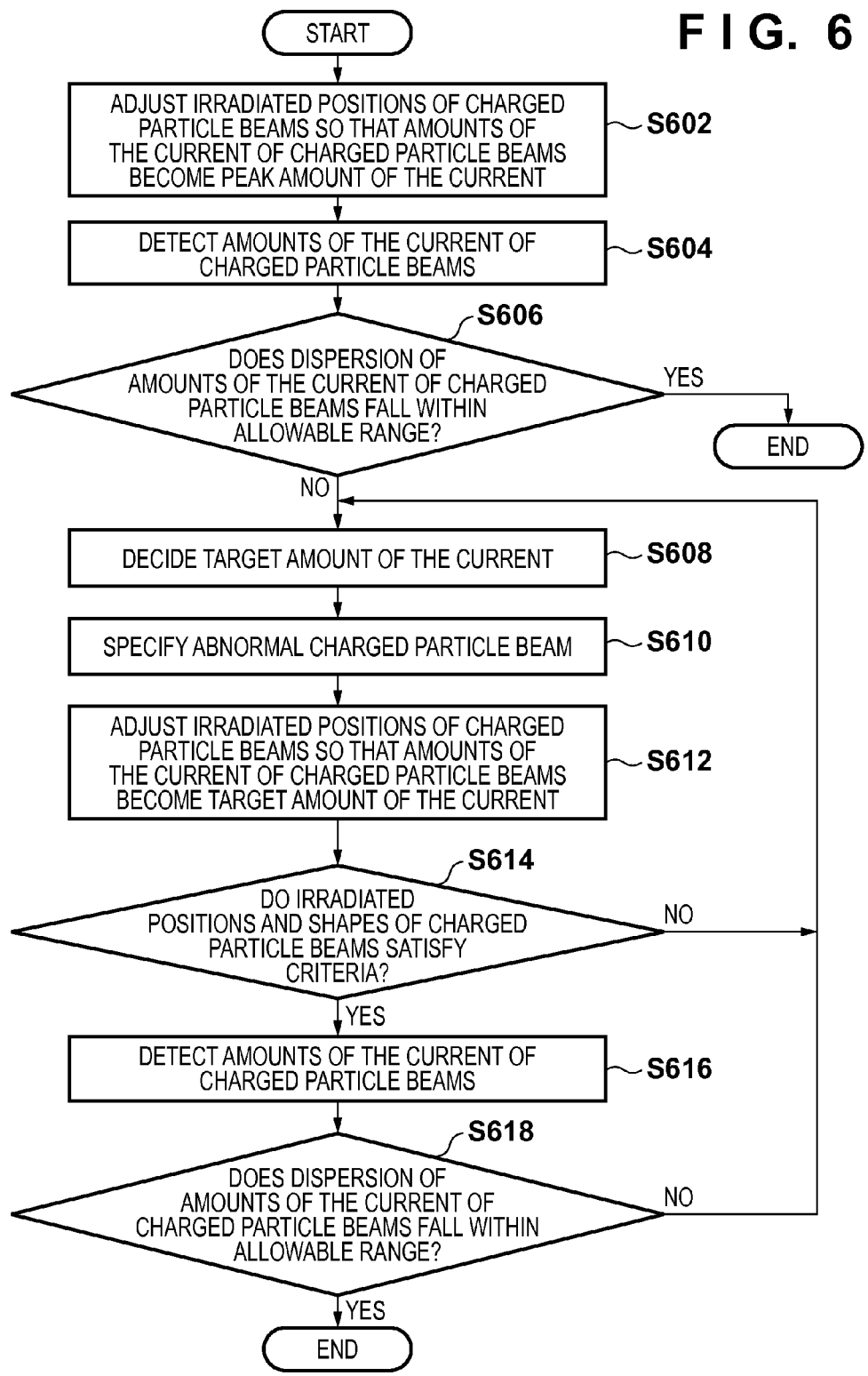

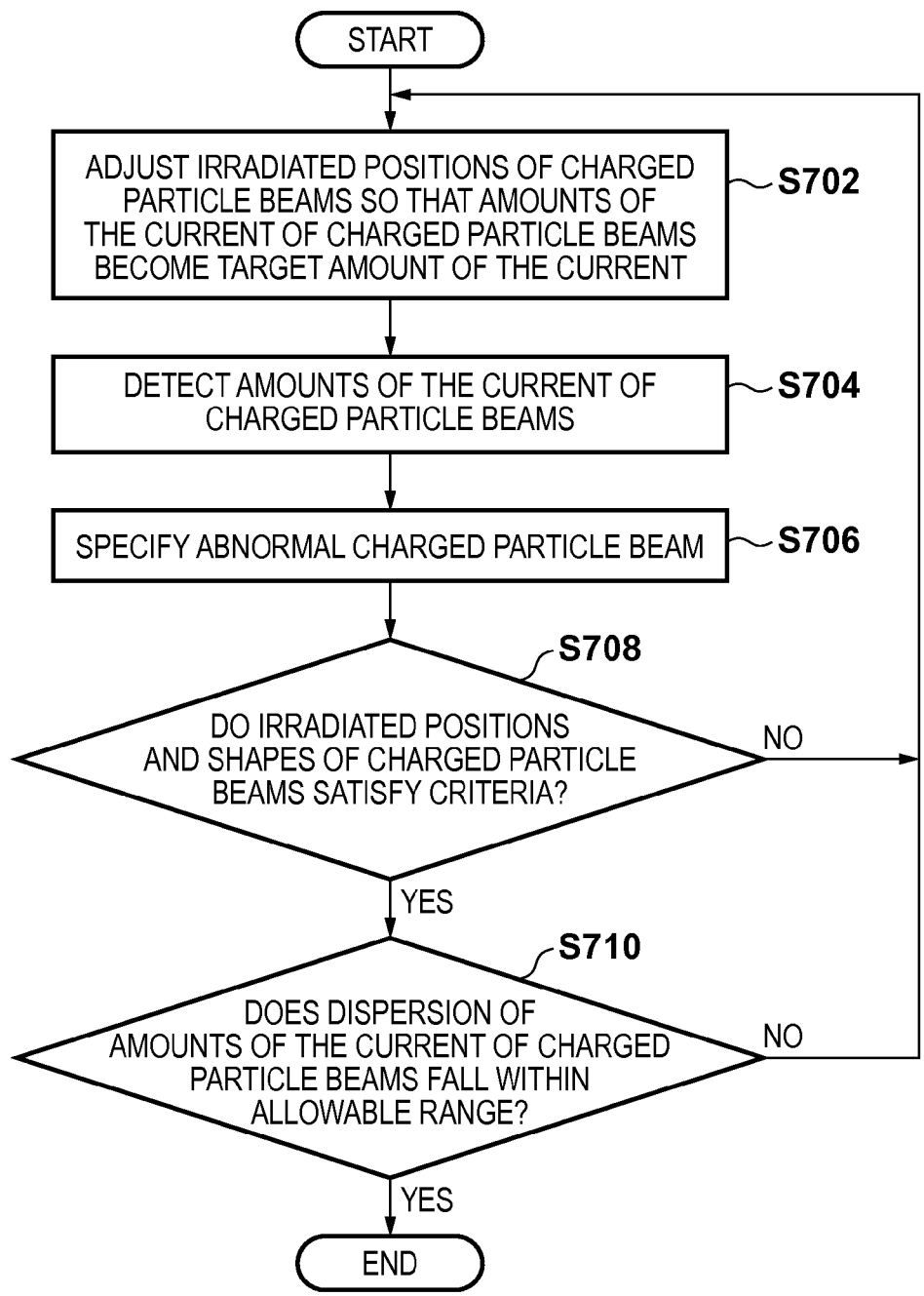
F I G. 7

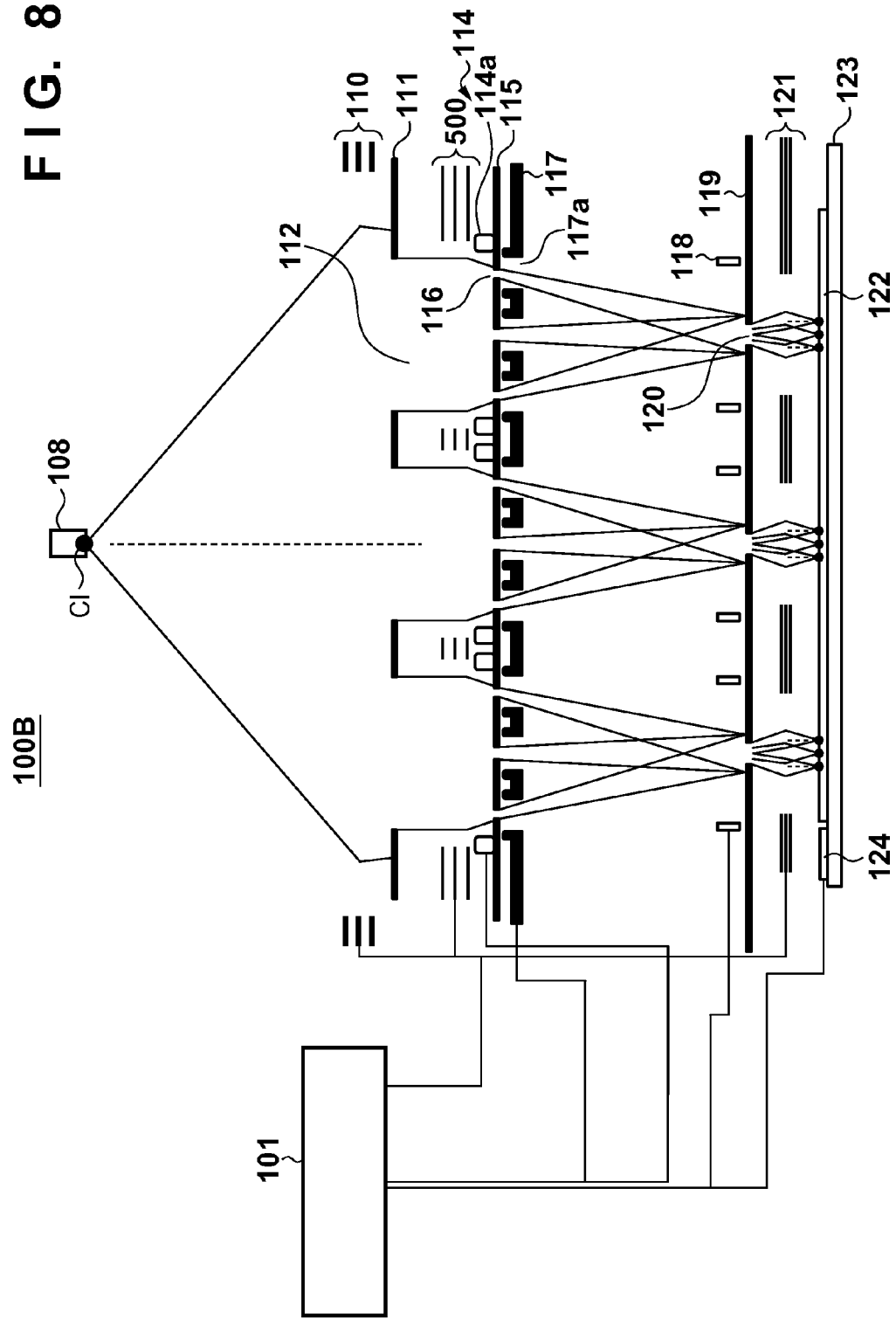

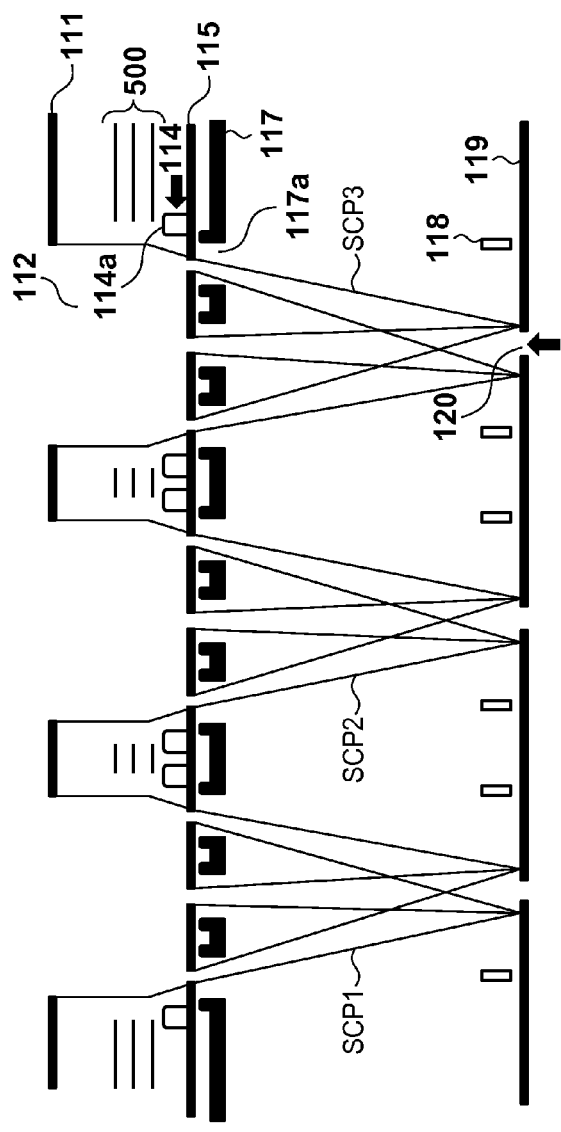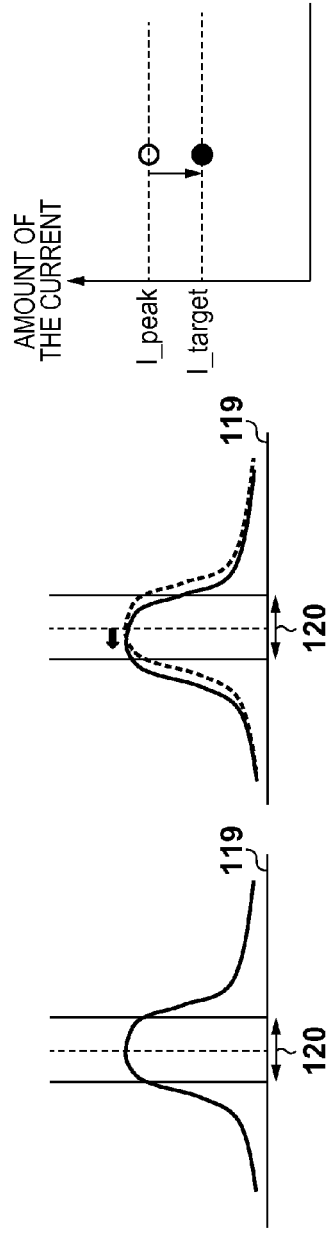

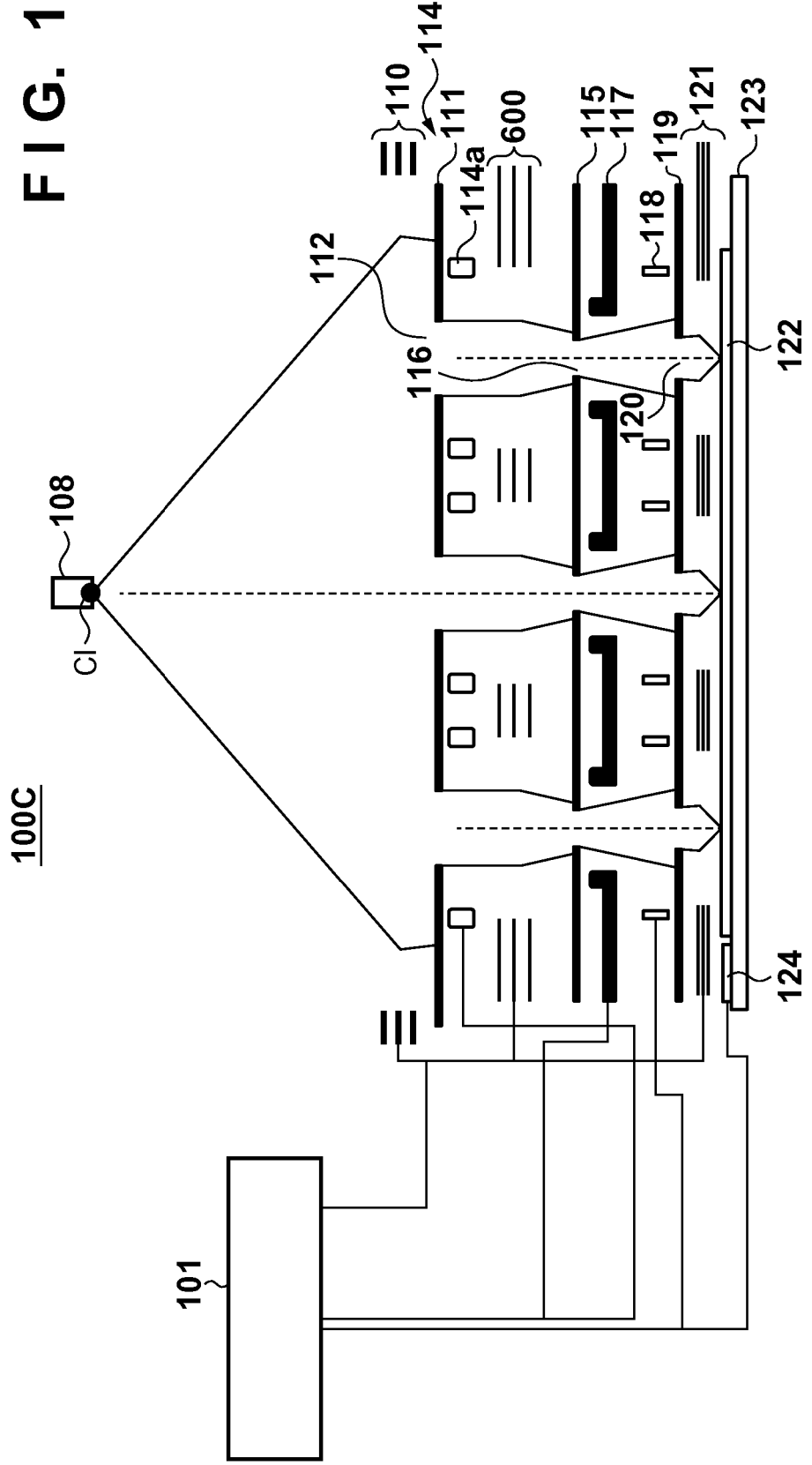

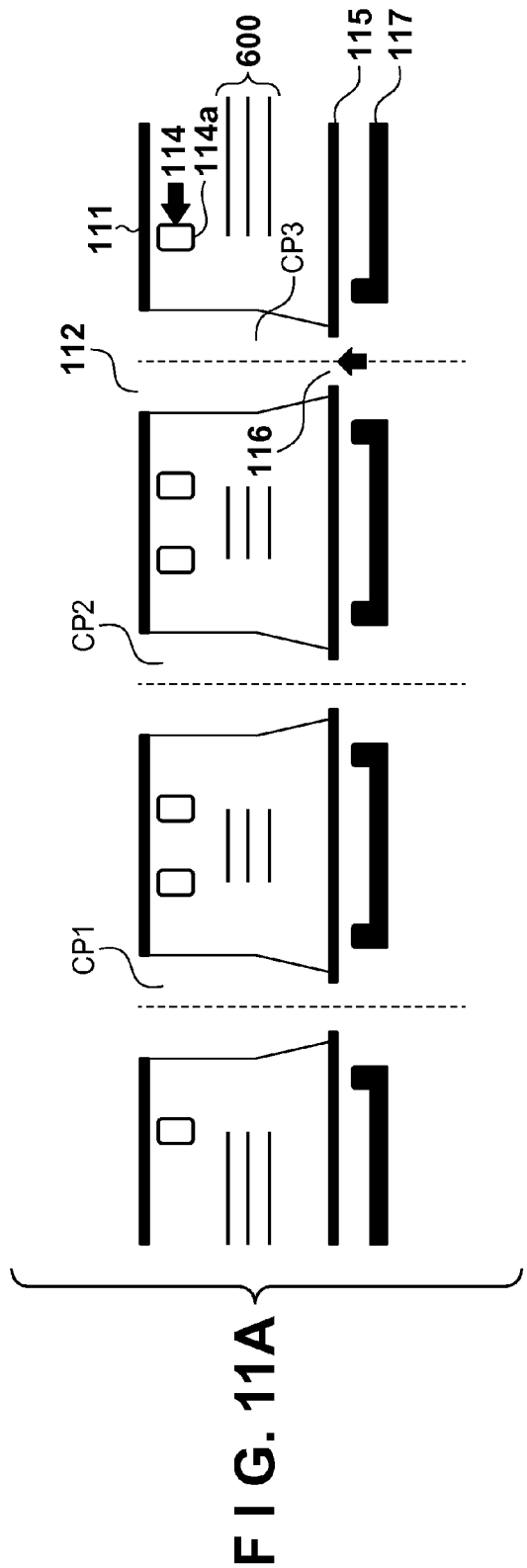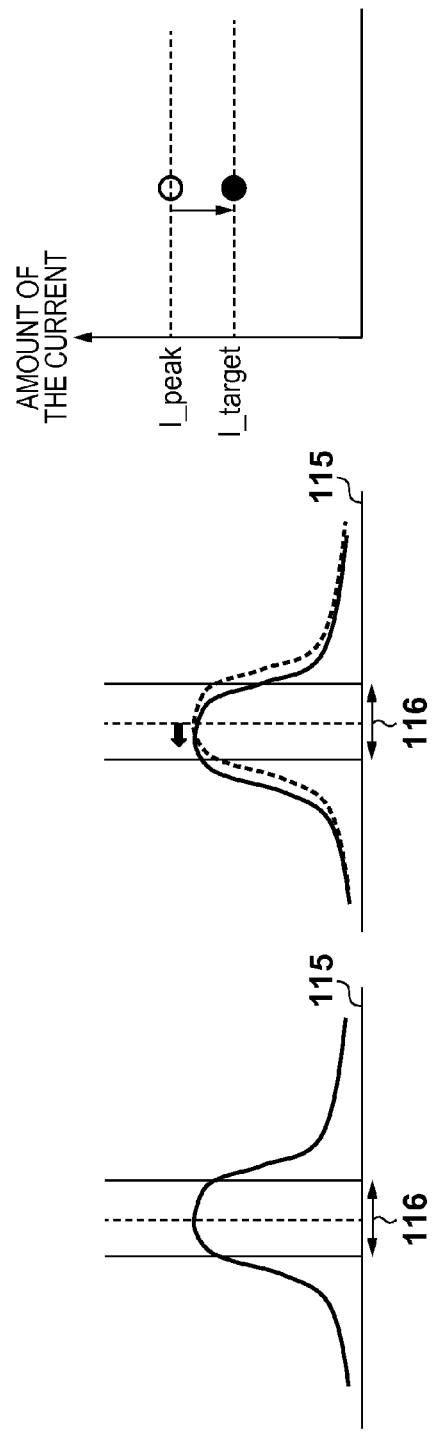

DRAWING APPARATUS AND METHOD OF MANUFACTURING ARTICLE

BACKGROUND OF THE INVENTION

1. Field of the Invention

The present invention relates to a drawing apparatus and a method of manufacturing an article.

2. Description of the Related Art

A drawing apparatus which performs drawing on a substrate with charged particle beams requires a large angle of view of a charged particle optical system (illumination optical system) in order to increase the throughput. However, a large angle of view of the charged particle optical system increases aberrations of the charged particle optical system, and there is a fear of degradation of telecentricity or generation of illuminance nonuniformity.

To solve this, Japanese Patent Laid-Open No. 2009-32691 discloses a technique of improving telecentricity by individually deflecting a plurality of charged particle beams split by an aperture. Japanese Patent Laid-Open No. 2010-41055 discloses a technique of correcting illuminance nonuniformity by using apertures for splitting a charged particle beam, the sizes of which are different depending on the position.

The apertures whose sizes are different depending on the position can correct assumed systematic illuminance nonuniformity. However, when illuminance nonuniformity deviates from the assumed value or an unsystematic (local) component is large, it is difficult to correct the illuminance nonuniformity. Every time illuminance nonuniformity deviates from the assumed value, a new aperture corresponding to the illuminance nonuniformity may be manufactured and used in the drawing apparatus (that is, the aperture is replaced). However, this prolongs the downtime of the drawing apparatus, decreases the throughput, and increases the cost.

SUMMARY OF THE INVENTION

The present invention provides a drawing apparatus advantageous for reducing the dispersion of the intensities of charged particle beams on a substrate.

According to one aspect of the present invention, there is provided a drawing apparatus which performs drawing on a substrate with a plurality of charged particle beams, including an aperture array configured to include a plurality of apertures for shaping the respective charged particle beams, a deflection unit configured to include a plurality of first deflectors which are arranged on a side, with respect to the aperture array, of a charged particle source for radiating a charged particle beam and which deflect the respective charged particle beams, and to individually change irradiated positions of the respective charged particle beams on the aperture array by driving the respective first deflectors, and a controller configured to control deflection of the charged particle beams by the first deflectors to reduce a dispersion of intensities of the respective charged particle beams on the substrate.

Further aspects of the present invention will become apparent from the following description of exemplary embodiments with reference to the attached drawings.

BRIEF DESCRIPTION OF THE DRAWINGS

FIG. 1 is a schematic view showing the arrangement of a drawing apparatus according to the first embodiment of the present invention.

FIGS. 2A to 2D are views for explaining adjustment processing of adjusting the amounts of the current of charged particle beams on a substrate in the drawing apparatus shown in FIG. 1.

FIGS. 3A to 3D are views for explaining correction of the dispersion of the amounts of the current of charged particle beams on the substrate in the drawing apparatus shown in FIG. 1.

FIGS. 4A and 4B are graphs schematically showing a change of the dispersion of the amounts of the current of charged particle beams on the substrate in the drawing apparatus shown in FIG. 1.

FIGS. 5A and 5B are graphs schematically showing a change of the dispersion of the amounts of the current of charged particle beams on the substrate in the drawing apparatus shown in FIG. 1.

FIG. 6 is a flowchart for explaining adjustment processing of adjusting the amounts of the current of charged particle beams irradiating the substrate in the drawing apparatus shown in FIG. 1.

FIG. 7 is a flowchart for explaining adjustment processing of adjusting the amounts of the current of charged particle beams irradiating the substrate in the drawing apparatus shown in FIG. 1.

FIG. 8 is a schematic view showing the arrangement of a drawing apparatus according to the second embodiment of the present invention.

FIGS. 9A to 9D are views for explaining adjustment processing of adjusting the amounts of the current of charged particle beams on a substrate in the drawing apparatus shown in FIG. 8.

FIG. 10 is a schematic view showing the arrangement of a drawing apparatus according to the third embodiment of the present invention.

FIGS. 11A to 11D are views for explaining adjustment processing of adjusting the amounts of the current of charged particle beams on a substrate in the drawing apparatus shown in FIG. 10.

DESCRIPTION OF THE EMBODIMENTS

Preferred embodiments of the present invention will be described below with reference to the accompanying drawings. Note that the same reference numerals denote the same members throughout the drawings, and a repetitive description thereof will not be given.

<First Embodiment>

FIG. 1 is a schematic view showing the arrangement of a drawing apparatus 100A according to the first embodiment of the present invention. The drawing apparatus 100A is implemented as a multi-charged particle beam drawing apparatus which performs drawing on a substrate with a plurality of charged particle beams, that is, draws a pattern on a substrate by using a plurality of charged particle beams. The charged particle beam is not limited to an electron beam and may be an ion beam or the like.

The drawing apparatus 100A includes a controller 101, charged particle source 108, collimator lens 110, aperture array 111, deflection unit 114, and projection aperture array 115. The drawing apparatus 100A also includes a blanker array 117, deflectors 118, a stop array 119, a projection lens array 121, a stage 123, and a Faraday cup 124.

The charged particle source 108 forms a crossover CI. A charged particle beam radiated from the crossover CI at a wide angle is substantially collimated by the collimator lens 110 and irradiates the aperture array 111. The charged particle source 108 is, for example, a thermionic charged particle source including, for example, an $LaB_6$ or BaO/W (dispenser cathode). The collimator lens 110 is formed from a so-called Einzel electrostatic lens including three electrodes each having a single hole. A negative potential is applied to the intermediate one of these three electrodes, and the upper and lower electrodes are grounded.

The charged particle beam irradiating the aperture array 111 is split into a plurality of charged particle beams CP by a plurality of apertures 112 formed in the aperture array 111. The charged particle beams CP are formed into charged particle beams whose diameters are defined (shaped) by (the sizes of) a plurality of apertures 116 formed in the projection aperture array 115 at the subsequent stage. The projection aperture array 115 is arranged at the object plane position with respect to the projection system at the subsequent stage. The charged particle beams defined by the apertures 116 of the projection aperture array 115 are reduced and projected by the projection system, and form images on a substrate.

The deflection unit 114, including a plurality of deflectors (first deflectors) 114a configured to deflect the respective charged particle beams CP defined by the projection aperture array 115, is arranged near the projection aperture array 115 (on the charged particle source side with respect to the stop array 119). The deflectors 114a are arranged within a plane parallel to the plane direction of the stop array 119. The deflection unit 114 individually changes the irradiated positions of the respective charged particle beams CP on the stop array 119 (on the aperture array) by driving the respective deflectors 114a. More specifically, the charged particle beams CP can be deflected in different directions at different sizes by supplying individual deflection signals (application voltage values) to the deflectors 114a. In the first embodiment, individual deflection signals are supplied to the respective charged particle beams CP. If this configuration is difficult, it may be simplified by, for example, classifying the charged particle beams CP into a plurality of groups and supplying a single deflection signal to a single group. For example, assuming that the number of charged particle beams is 10,000 and the charged particle beams are grouped into every 100 charged particle beams, the number of groups is 100 and the number of deflection signals suffices to be 100. Even the case in which deflection signals (deflection units 114) are simplified by this grouping can be considered to fall within applications of the present invention.

Similar to the deflection unit 114, the blanker array 117 is arranged near the projection aperture array 115. The blanker array 117 is a device including a plurality of deflection electrode pairs, that is, a plurality of deflectors (second deflectors) 117a which receive binary deflection signals and can quickly control (deflect) the respective charged particle beams CP. The blanker array 117 performs blanking individually for the charged particle beams CP based on blanking signals. A voltage is not applied to the deflector 117a of the blanker array 117 when no charged particle beam is blanked, and is applied to the deflector 117a of the blanker array 117 when a charged particle beam is blanked. Charged particle beams deflected by the blanker array 117 are cut off by the stop array 119 at the subsequent stage, and change to the blanking state. In cooperation with the stop array 119, the blanker array 117 functions as a blanking deflection unit which performs irradiation or non-irradiation of a substrate 122 with charged particle beams by driving the respective deflectors 117a.

The difference between the function of the deflection unit 114 (deflector 114a) and that of the blanker array 117 (deflector 117a) will be explained. A multilevel deflection signal (deflection amount for each charged particle beam) (for example, analog signal) is supplied to the deflector 114a of the deflection unit 114, but the speed of driving (response) may be low. In contrast, the blanker array 117 controls only blanking, so a binary deflection signal (for example, ON or OFF signal) is supplied to the deflector 117a, but the speed of driving (response) needs to be high. When a deflection device (deflector) to which a multilevel signal capable of high-speed driving can be supplied as a deflection signal can be configured, a deflection device having both the function of the deflection unit 114 and that of the blanker array 117 may be configured.

Charged particle beams defined by the apertures 116 of the projection aperture array 115 irradiate the stop array 119. The stop array 119 is formed from a conductor plate having a plurality of apertures 120 formed in correspondence with the respective apertures 112 of the aperture array 111. The stop array 119 is an aperture array arranged at a position optically conjugate to the front focal plane position of the projection lens array 121, that is, the position of the pupil plane with respect to the imaging plane on which a charged particle beam forms an image (plane on which the substrate 122 is arranged). The stop array 119 therefore has a stop function of defining the NA (Numerical Aperture) of the projection system.

Charged particle beams having NAs defined by the stop array 119 are converged by the projection lens array 121 and form images on the substrate 122. The projection lens array 121 is formed from a so-called Einzel electrostatic lens including three electrodes each having multiple holes. A negative potential is applied to the intermediate one of these three electrodes, and the upper and lower electrodes are grounded. The projection lens array 121 has a projection magnification of, for example, about $1/100$. When the diameter of the aperture 116 of the projection aperture array 115 is about 2 μm, a charged particle beam having a spot diameter of about 20 nm forms an image on the substrate 122.

The deflector 118 deflects (scans) a charged particle beam on the substrate 122. The deflector 118 is formed from a pair of facing electrodes. To perform deflection at two stages in each of the x and y directions, the deflector 118 is formed from four electrode pairs. The deflector 118 is driven in accordance with a signal from the controller 101.

On the stage 123 which moves while holding the substrate 122, the Faraday cup 124 is arranged as a detector which detects the intensities (amounts of the current) of a plurality of charged particle beams on a substrate. Based on the amounts of the current of the charged particle beams detected by the Faraday cup 124, the controller 101 calculates the dispersion of the amounts of the current of the charged particle beams. Note that the detector for detecting the intensity of a charged particle beam is not limited to the Faraday cup 124, and another element capable of detecting the amount of the current of a charged particle beam may be used instead of the Faraday cup 124.

The controller 101 includes a CPU and memory, and controls the overall (operation of) drawing apparatus 100A. For example, the controller 101 controls drawing processing of drawing a pattern on the substrate 122. In the first embodiment, the controller 101 controls the deflection unit 114 (deflection of charged particle beams by the deflectors 114a) to reduce the dispersion (illuminance nonuniformity) of the amounts of the current of charged particle beams on a substrate.

When drawing a pattern, while the stage 123 holding the substrate 122 is continuously moved in the x direction, the deflectors 118 deflect charged particle beams on the substrate 122 in the y direction, and the blanker array 117 performs blanking in accordance with a pattern to be drawn. At this time, the deflection (scanning) of charged particle beams by the deflectors 118 is performed based on the length measurement result of the stage 123 in real time by a laser length measuring unit.

In addition to the arrangement (blanker array 117 and stop array 119) for implementing the blanking function, the drawing apparatus 100A has an arrangement (deflection unit 114) for implementing a function of correcting (reducing) the dispersion (illuminance nonuniformity) of the amounts of the current of charged particle beams on a substrate. In other words, the drawing apparatus 100A can adjust the amounts of the current of charged particle beams irradiating the substrate 122 by using the deflection unit 114.

Adjustment processing of correcting the dispersion of the amounts of the current of charged particle beams on a substrate in the drawing apparatus 100A, that is, adjusting the amounts of the current of charged particle beams irradiating the substrate 122 will be explained with reference to FIGS. 2A to 2D.

FIG. 2A is a view showing an arrangement from the aperture array 111 to the stop array 119. Referring to FIG. 2A, the deflection unit 114 deflects only a charged particle beam CP3 out of three charged particle beams CP1, CP2, and CP3. Hence, the irradiated position of the charged particle beam CP3 on the stop array 119 after deflection by the deflection unit 114 shifts from that of the charged particle beam CP3 on the stop array 119 before deflection by the deflection unit 114. Assume that the irradiated position of the charged particle beam CP3 on the stop array 119 before deflection by the deflection unit 114 is adjusted to a position where the amount of the current of the charged particle beam CP3 passing through the aperture 120 of the stop array 119 becomes maximum. In this case, if the deflection unit 114 deflects the charged particle beam CP3, the amount of the current of the charged particle beam CP3 passing through the aperture 120 of the stop array 119 decreases unless the shape of the charged particle beam CP3 with respect to the irradiated position is a perfect rectangle.

FIG. 2B shows the distribution of the amounts of the current of charged particle beams when the irradiated positions of the charged particle beams on the stop array 119 are adjusted to positions where the amounts of the current of the charged particle beams passing through the apertures 120 become maximum. In FIG. 2C, a solid line represents the distribution of the amounts of the current of the charged particle beams when the deflection unit 114 intentionally shifts the irradiated positions of the charged particle beams on the stop array 119 from the state shown in FIG. 2B to positions where the amounts of the current of the charged particle beams passing through the apertures 120 decrease. Also, in FIG. 2C, a dotted line represents the distribution (that is, distribution shown in FIG. 2B) of the amounts of the current of the charged particle beams when the amounts of the current of the charged particle beams passing through the apertures 120 of the stop array 119 become maximum.

Referring to FIGS. 2B and 2C, the amounts of the current of the charged particle beams passing through the apertures 120 can be adjusted to a target amount of the current (target intensity) equal to or smaller than a peak amount of the current by continuously changing the irradiated positions of the charged particle beams on the stop array 119 by the deflection unit 114. FIG. 2D shows a state in which the amount of the current of a charged particle beam passing through the aperture 120 of the stop array 119 is adjusted from a peak amount of the current I_peak to a target amount of the current I_target by shifting the irradiated position by the deflection unit 114. In FIG. 2D, the ordinate represents the amount of the current of a charged particle beam passing through the aperture 120 of the stop array 119. To adjust the amount of the current of a charged particle beam passing through the aperture 120 of the stop array 119 to the target amount of the current, the amount of the current of the charged particle beam passing through the aperture 120 needs to be detected. For this purpose, in the first embodiment, the Faraday cup 124 arranged on the stage 123 detects the amount of the current of the charged particle beam passing through the aperture 120 of the stop array 119.

Correction of the dispersion of the amounts of the current of charged particle beams on a substrate will be explained with reference to FIGS. 3A to 3D. FIG. 3A shows the amounts of the current of charged particle beams CP1 to CP7 passing through the apertures 120 of the stop array 119 before the deflection unit 114 shifts the irradiated positions. FIGS. 3B and 3C show the amounts of the current of the charged particle beams CP1 to CP7 passing through the apertures 120 of the stop array 119 after the deflection unit 114 shifts the irradiated positions. In FIGS. 3B and 3C, open circles indicate the amounts of the current of the charged particle beams CP1 to CP7 before the deflection unit 114 shifts the irradiated positions, and filled circles indicate the amounts of the current of the charged particle beams CP1 to CP7 after the deflection unit 114 shifts the irradiated positions.

As shown in FIG. 3A, in the drawing apparatus 100A, the amounts of the current of charged particle beams on a substrate generally vary owing to illuminance nonuniformity of the illumination system and the like. However, by shifting the irradiated positions of the charged particle beams CP1 to CP7 by the deflection unit 114, as described above, the amounts of the current of the charged particle beams CP1 to CP7 passing through the apertures 120 of the stop array 119 can be adjusted to be equal to or smaller than the peak amount of the current.

In FIG. 3B, the amount of the current of the charged particle beam CP4 is set as the target amount of the current I_target. The deflection unit 114 shifts the irradiated positions of the charged particle beams CP1, CP2, CP3, CP5, and CP6 on the stop array 119 so that the amounts of the current of the charged particle beams CP1, CP2, CP3, CP5, and CP6 become the target amount of the current I_target. The amount of the current (peak amount of the current) of the charged particle beam CP7 is smaller than the target amount of the current I_target (amount of the current of the charged particle beam CP4). In this case, even if the deflection unit 114 is used, the amount of the current cannot be adjusted to be larger than the peak amount of the current of the charged particle beam, so the amount of the current of the charged particle beam CP7 cannot be adjusted to the target amount of the current I_target. If the difference between the amount of the current of a charged particle beam and the target amount of the current falls within an allowable range, the charged particle beam can be used for pattern drawing. However, if this difference falls outside the allowable range, the charged particle beam cannot be used for pattern drawing (is set as an abnormal charged particle beam). In FIG. 3B, the charged particle beam CP7 is specified as an abnormal charged particle beam, and deflected by the blanker array 117 not to irradiate the substrate 122 with the charged particle beam CP7.

If the amount of the current of the charged particle beam CP7 is set as the target amount of the current I_target, as shown in FIG. 3C, the amounts of the current of the charged particle beams CP1 to CP6 can be adjusted to the target amount of the current I_target. Hence, all the charged particle beams CP1 to CP7 can be used for pattern drawing. In this manner, when the amount of the current of the charged particle beam CP7 is set as the target amount of the current I_target, the dispersion of the amounts of the current of the charged particle beams CP1 to CP7 on the substrate can be corrected. However, the sum (total amount of the current) of the amounts of the current of the charged particle beams CP1 to CP7 on the substrate may greatly decrease.

FIG. 3D shows the amounts of the current of the charged particle beams CP1 to CP7 and the total amount of the current in the state (initial) shown in FIG. 3A, the state (case 1) shown in FIG. 3B, and the state (case 2) shown in FIG. 3C. Referring to FIG. 3D, the total amount of the current decreases in the case (case 1 and case 2) in which the dispersion of the amounts of the current of the charged particle beams CP1 to CP7 on the substrate is corrected, compared to the case (initial) in which the dispersion of the amounts of the current of the charged particle beams CP1 to CP7 on the substrate is not corrected. However, by setting an appropriate amount of the current (that is, an amount of the current at which the sum of the amounts of the current of charged particle beams becomes maximum) as the target amount of the current, the dispersion of the amounts of the current of the charged particle beams CP1 to CP7 can be corrected while suppressing a decrease in total amount of the current.

A comparison between case 1 and case 2 shown in FIG. 3D reveals that all the charged particle beams CP1 to CP7 can be used for pattern drawing in case 2, but the amounts of the current of the charged particle beams CP1 to CP7 greatly decrease, drastically decreasing the total value of the current. In case 1, the charged particle beam CP7 is specified as an abnormal charged particle beam and cannot be used for pattern drawing, but a decrease in the amount of the current of each of the charged particle beams CP1 to CP6 is suppressed. Accordingly, a decrease in total amount of the current can be suppressed while reducing the dispersion of the amounts of the current of the charged particle beams CP1 to CP7.

However, case 1 shown in FIG. 3D is not always superior to case 2. For example, depending on a pattern to be drawn on the substrate 122, drawing cannot be performed without using the charged particle beam CP7 or needs to be performed twice. In such a case, case 2 may increase the throughput of the drawing apparatus 100A than in case 1. Therefore, the setting of the target amount of the current and the specifying of an abnormal charged particle beam depend on the specifications of the drawing apparatus 100A. Note that applications of the present invention cover all arrangements in which the amounts of the current of charged particle beams passing through the apertures 120 of the stop array 119 are adjusted to the target amount of the current by shifting (changing) their irradiated positions by the deflection unit 114.

FIGS. 4A and 4B are graphs schematically showing an example of a change of the dispersion of the amounts of the current of charged particle beams on a substrate. FIG. 4A shows the distribution of the amounts of the current of charged particle beams before adjusting the amounts of the current of the charged particle beams on the substrate. FIG. 4B shows the distribution of the amounts of the current of charged particle beams after adjusting the amounts of the current of the charged particle beams on the substrate. In FIGS. 4A and 4B, the ordinate represents the amount of the current of a charged particle beam, and the abscissa represents the number (frequency) of charged particle beams. Strictly speaking, the distribution of the amounts of the current of charged particle beams is a discrete distribution, but is illustrated as a continuous distribution in FIGS. 4A and 4B.

Referring to FIG. 4A, the distribution of the amounts of the current of charged particle beams before adjusting the amounts of the current of the charged particle beams on the substrate has a predetermined dispersion (deviation) owing to illuminance nonuniformity of the illumination system or the like, as described above. Adjustment of the amounts of the current of charged particle beams to be the target amount of the current I_target in the distribution shown in FIG. 4A will be considered. FIG. 4A shows an allowable adjustment amount Allowable max_shift by the deflection unit 114. This allowable adjustment amount is decided based on, for example, the maximum deflection amount of a charged particle beam by the deflector 114a of the deflection unit 114, or aberration deterioration by adjusting the amount of the current of a charged particle beam. The maximum deflection amount of a charged particle beam by the deflector 114a is decided from the specifications of the drawing apparatus 100A. Aberration deterioration by adjusting the amount of the current of a charged particle beam is restricted to a range where the aberration deterioration can be corrected.

The amount of the current of a charged particle beam cannot be adjusted by more than the allowable adjustment amount Allowable max_shift by the deflection unit 114. Of charged particle beams, a charged particle beam for which the difference between the amount of the current and the target amount of the current I_target is equal to or larger than the allowable adjustment amount cannot be adjusted to have the target amount of the current I_target. Such a charged particle beam is specified as an abnormal charged particle beam and, for example, deflected by the blanker array 117 not to irradiate the substrate 122 with this charged particle beam (not to be used for pattern drawing).

Also, a charged particle beam having a peak amount of the current smaller than the target amount of the current I_target cannot be adjusted to have the target amount of the current I_target, as described above. However, all charged particle beams each having a peak amount of the current smaller than the target amount of the current I_target need not be specified as abnormal charged particle beams. For example, a charged particle beam for which the difference between the peak amount of the current and the target amount of the current I_target falls within an allowable range allowable min_I may be used for pattern drawing even if the peak amount of the current is smaller than the target amount of the current I_target. Note that a charged particle beam for which the difference between the peak amount of the current and the target amount of the current I_target falls outside the allowable range allowable min_I needs to be specified as an abnormal charged particle beam not to use it for pattern drawing.

In this fashion, the amounts of the current of charged particle beams on the substrate are adjusted to be the target amount of the current I_target in the distribution shown in FIG. 4A, obtaining the distribution shown in FIG. 4B. Referring to FIG. 4B, the amounts of the current of the charged particle beams on the substrate are localized in the target amount of the current I_target, and the dispersion (deviation) is reduced in this distribution.

FIGS. 5A and 5B are graphs schematically showing another example of a change of the dispersion of the amounts of the current of charged particle beams on a substrate. FIG. 5A shows the distribution of the amounts of the current of charged particle beams before adjusting the amounts of the current of the charged particle beams on the substrate. FIG. 5B shows the distribution of the amounts of the current of charged particle beams after adjusting the amounts of the current of the charged particle beams on the substrate.

In FIG. 4A, of charged particle beams, a charged particle beam for which the difference between the amount of the current and the target amount of the current I_target is larger than the allowable adjustment amount Allowable max_shift is specified as an abnormal charged particle beam. To the contrary, in FIG. 5A, the amount of the current of even such a charged particle beam is adjusted within the range of the allowable adjustment amount Allowable max_shift. In other words, in FIG. 5A, the amount of the current of a charged particle beam having a large difference between the peak amount of the current and the target amount of the current I_target is adjusted to be close to the target amount of the current I_target by the allowable adjustment amount Allowable max_shift. This can be regarded as setting another target amount of the current for a charged particle beam having a large difference between the peak amount of the current and the target amount of the current I_target. In this way, the amounts of the current of charged particle beams on the substrate are adjusted to be or be close to the target amount of the current I_target in the distribution shown in FIG. 5A, obtaining the distribution shown in FIG. 5B.

FIGS. 6 and 7 are flowcharts for explaining adjustment processing of correcting the dispersion of the amounts of the current of charged particle beams on a substrate in the drawing apparatus 100A, that is, adjusting the amounts of the current of charged particle beams irradiating the substrate 122. This adjustment processing is executed by performing centralized control of the respective units of the drawing apparatus 100A by the controller 101. FIG. 6 is a flowchart when the target amount of the current is decided in the sequence of the adjustment processing. FIG. 7 is a flowchart when the target amount of the current is decided in advance in accordance with the specifications of the drawing apparatus 100A or the like.

First, adjustment processing shown in FIG. 6 will be explained. In step S602, the deflection unit 114 adjusts the irradiated positions of charged particle beams on the stop array 119 so that the amounts of the current of the charged particle beams passing through the apertures 120 of the stop array 119 become maximum (that is, the peak amount of the current). Since the amounts of the current of the charged particle beams passing through the apertures 120 of the stop array 119 become the peak amount of the current in step S602, the sum of the amounts of the current of the charged particle beams, that is, the total amount of the current becomes maximum.

In step S604, the amounts of the current of the charged particle beams whose irradiated positions have been adjusted in step S602 are detected. For example, the Faraday cup 124 arranged on the stage 123 detects the amounts of the current of the charged particle beams.

In step S606, it is determined whether the dispersion of the amounts of the current of the charged particle beams detected in step S604 falls within the allowable range. From the viewpoint of the throughput, it is preferable to perform drawing in a state in which the amounts of the current of charged particle beams become the peak amount of the current. However, if the dispersion of the amounts of the current of charged particle beams does not fall within the allowable range, the amounts of the current of the charged particle beams need to be adjusted. Hence, if the dispersion of the amounts of the current of the charged particle beams detected in step S604 falls outside the allowable range, the process shifts to step S606. If the dispersion of the amounts of the current of the charged particle beams detected in step S604 falls within the allowable range, the process ends because the amounts of the current of the charged particle beams need not be adjusted.

In step S608, the target amount of the current is decided based on the amounts of the current of the charged particle beams detected in step S604 and the maximum deflection amount of a charged particle beam by the deflector 114a of the deflection unit 114. Note that the target amount of the current suffices to be decided as described with reference to FIGS. 4A, 4B, 5A, and 5B.

In step S610, an abnormal charged particle beam is specified based on the amounts of the current of the charged particle beams detected in step S604, the maximum deflection amount of a charged particle beam by the deflector 114a of the deflection unit 114, and the target amount of the current decided in step S608. Note that an abnormal charged particle beam is suffices to be specified as described with reference to FIGS. 4A, 4B, 5A, and 5B.

In step S612, the deflection unit 114 adjusts the irradiated positions of the charged particle beams on the stop array 119 so that the amounts of the current of the charged particle beams passing through the apertures 120 of the stop array 119 become the target amount of the current decided in step S608. Also, the blanker array 117 deflects the abnormal charged particle beam specified in step S610 not to irradiate the substrate 122 with it.

In step S614, it is determined whether the irradiated positions and shapes of the charged particle beams on the substrate satisfy criteria. When the deflection unit 114 adjusts the irradiated positions of charged particle beams on the stop array 119, the irradiated positions and shapes of the charged particle beams on the substrate sometimes change. Thus, it is necessary to detect the irradiated positions and shapes of charged particle beams on the substrate after adjusting the irradiated positions of the charged particle beams on the stop array 119, and then determine whether they satisfy the criteria. Note that the irradiated positions and shapes of charged particle beams on the substrate can be detected by, for example, arranging a knife edge on the Faraday cup 124.

If the irradiated positions and shapes of the charged particle beams on the substrate do not satisfy the criteria, the process returns to step S608 to decide a new target amount of the current. At this time, a charged particle beam whose irradiated position and shape on the substrate do not satisfy the criteria may be specified as an abnormal charged particle beam. For example, when there are many charged particle beams whose irradiated positions and shapes on the substrate do not satisfy the criteria, the charged particle beams are considered to be greatly influenced by deflection. Hence, the allowable adjustment amount is set to be smaller than the initial value, and a new target amount of the current is decided.

If the irradiated positions and shapes of the charged particle beams on the substrate satisfy the criteria, the process shifts to step S616 to detect the amounts of the current of the charged particle beams whose irradiated positions have been adjusted in step S612.

In step S618, it is determined whether the dispersion of the amounts of the current of the charged particle beams detected in step S616 falls within the allowable range. If the dispersion of the amounts of the current of the charged particle beams detected in step S616 falls outside the allowable range, the process returns to step S608 to decide a new target amount of the current. If the dispersion of the amounts of the current of the charged particle beams detected in step S616 falls within the allowable range, the process ends.

Next, adjustment processing shown in FIG. 7 will be explained. In step S702, the deflection unit 114 adjusts the irradiated positions of charged particle beams on the stop array 119 so that the amounts of the current of the charged particle beams passing through the apertures 120 of the stop array 119 become a predetermined target amount of the current. Since the target amount of the current (for example, 500 µA±10 µA) is decided in advance, the amounts of the current of the charged particle beams can be adjusted to the target amount of the current from the beginning without adjusting them to the peak amount of the current.

In step S704, the amounts of the current of the charged particle beams whose irradiated positions have been adjusted in step S702 are detected. In step S706, an abnormal charged particle beam is specified based on the amounts of the current of the charged particle beams detected in step S704. In this way, a charged particle beam whose amount of the current does not become the target amount of the current even upon adjusting the irradiated positions of charged particle beams on the stop array 119 is specified as an abnormal charged particle beam, and deflected by the blanker array 117 not to irradiate the substrate 122 with this charged particle beam.

In step S708, similar to step S614, it is determined whether the irradiated positions and shapes of the charged particle beams on the substrate satisfy criteria. If the irradiated positions and shapes of the charged particle beams on the substrate do not satisfy the criteria, the process returns to step S702 to adjust again the irradiated positions of the charged particle beams on the stop array 119. At this time, the predetermined target amount of the current may be changed. If the irradiated positions and shapes of the charged particle beams on the substrate satisfy the criteria, the process shifts to step S710.

In step S710, it is determined whether the dispersion of the amounts of the current of the charged particle beams detected in step S704 falls within the allowable range. If the dispersion of the amounts of the current of the charged particle beams detected in step S704 falls outside the allowable range, the process returns to step S702 to adjust again the irradiated positions of the charged particle beams on the stop array 119. At this time, the predetermined target amount of the current may be changed. If the dispersion of the amounts of the current of the charged particle beams detected in step S704 falls within the allowable range, the process ends.

As described above, the drawing apparatus 100A according to the first embodiment can reduce the dispersion of the amounts of the current of charged particle beams on a substrate by using the deflection unit 114. The drawing apparatus 100A can perform drawing processing of drawing a pattern on the substrate 122 while suppressing a decrease in throughput and an increase in cost.

The deflection unit 114 deflects a charged particle beam by using the deflector 114a, but may deflect it by using a lens instead of the deflector 114a.

<Second Embodiment>

FIG. 8 is a schematic view showing the arrangement of a drawing apparatus 100B according to the second embodiment of the present invention. The drawing apparatus 100B has the same arrangement as that of the drawing apparatus 100A, and further includes a convergent lens array 500 arranged at the subsequent stage of an aperture array 111.

A plurality of apertures (3×3 apertures in the second embodiment) 116 are formed in a projection aperture array 115 for one aperture 112 of the aperture array 111. A charged particle beam split by the aperture array 111 is further split into a plurality of charged particle sub-beams by the apertures 116 of the projection aperture array 115.

A blanker array 117 is configured so that deflectors 117a are arranged for the respective apertures 116 of the projection aperture array 115. In other words, the deflectors 117a are arranged for respective charged particle sub-beams, and the blanker array 117 can individually perform blanking for the charged particle sub-beams.

The convergent lens array 500 has a lens power designed to converge charged particle sub-beams (3×3 charged particle sub-beams in the second embodiment) split by the projection aperture array 115 to a corresponding aperture 120 of a stop array 119. The convergent lens array 500 is formed from, for example, an Einzel electrostatic lens, similar to a projection lens array 121. The convergent lens array 500 optically has a field lens function of guiding 3×3 charged particle sub-beams to the common aperture 120 of the stop array 119.

Charged particle sub-beams having passed through the stop array 119 are reduced and projected onto a substrate 122 via a projection lens array 121 at the subsequent stage. The projection lens array 121 optically reduces and projects the aperture 116 of the projection aperture array 115 for each lens (column) of the projection lens array 121.

Similar to the drawing apparatus 100A, a deflection unit 114 is arranged near the projection aperture array 115. In the second embodiment, the deflection unit 114 can individually deflect charged particle sub-beams for each group (that is, every 3×3 charged particle sub-beams). In other words, the deflection unit 114 can adjust the amounts of the current of charged particle beams passing through the apertures 120 of the stop array 119 for each group of charged particle sub-beams.

Adjustment processing of correcting the dispersion of the amounts of the current of charged particle beams on a substrate in the drawing apparatus 100B, that is, adjusting the amounts of the current of charged particle beams irradiating the substrate 122 will be explained with reference to FIGS. 9A to 9D.

FIG. 9A is a view showing an arrangement from the aperture array 111 to the stop array 119. Referring to FIG. 9A, the deflection unit 114 deflects only a charged particle sub-beam group SCP3 out of three charged particle sub-beam groups SCP1, SCP2, and SCP3. Hence, the irradiated position of the charged particle sub-beam group SCP3 on the stop array 119 after deflection by the deflection unit 114 shifts from that of the charged particle sub-beam group SCP3 on the stop array 119 before deflection by the deflection unit 114. Assume that the irradiated position of the charged particle sub-beam group SCP3 on the stop array 119 before deflection by the deflection unit 114 is adjusted to a position where the amount of the current of the charged particle sub-beam group SCP3 passing through the aperture 120 of the stop array 119 becomes maximum. In this case, if the deflection unit 114 deflects the charged particle sub-beam group SCP3, the amount of the current of the charged particle sub-beam group SCP3 passing through the aperture 120 of the stop array 119 decreases unless the shape of the charged particle sub-beam group SCP3 with respect to the irradiated position is a perfect rectangle.

FIG. 9B shows the distribution of the amounts of the current (current densities) of charged particle sub-beam groups when the irradiated positions of the charged particle sub-beam groups on the stop array 119 are adjusted to positions where the amounts of the current of the charged particle sub-beam groups passing through the apertures 120 become maximum. In FIG. 9C, a solid line represents the distribution of the amounts of the current (current densities) of the charged particle sub-beam groups when the deflection unit 114 intentionally shifts the irradiated positions of the charged particle sub-beam groups on the stop array 119 from the state shown in FIG. 9B. Also, in FIG. 9C, a dotted line represents the distribution (that is, distribution shown in FIG. 9B) of the amounts of the current of the charged particle sub-beam groups when the amounts of the current of the charged particle sub-beam groups passing through the apertures 120 of the stop array 119 become maximum.

Referring to FIGS. 9B and 9C, the amounts of the current of the charged particle sub-beam groups passing through the apertures 120 can be adjusted to a target amount of the current (target intensity) equal to or smaller than a peak amount of the current by changing the irradiated positions of the charged particle sub-beam groups on the stop array 119 by the deflection unit 114. FIG. 9D shows a state in which the amount of the current of a charged particle sub-beam group passing through the aperture 120 of the stop array 119 is adjusted from a peak amount of the current I_peak to a target amount of the current I_target by shifting the irradiated position by the deflection unit 114.

As described above, the difference between the drawing apparatuses 100B and 100A is that the projection aperture array 115 further splits a charged particle beam into a plurality of charged particle sub-beams. The drawing apparatus 100B can also reduce the dispersion of the amounts of the current of charged particle beams on a substrate by adjusting the amounts of the current of the charged particle beams passing through the apertures 120 of the stop array 119 by the deflection unit 114 for each charged particle sub-beam group. Similar to the drawing apparatus 100A, the drawing apparatus 100B can perform drawing processing of drawing a pattern on the substrate 122 while suppressing a decrease in throughput and an increase in cost.

The deflection unit 114 deflects each charged particle sub-beam group in the second embodiment, but is not limited to this and may deflect each charged particle sub-beam. In this case, the deflection unit 114 is configured by arranging the deflector 114a for each charged particle sub-beam.

<Third Embodiment>

FIG. 10 is a schematic view showing the arrangement of a drawing apparatus 100C according to the third embodiment of the present invention. The drawing apparatus 100C has the same arrangement as that of the drawing apparatus 100A, and further includes a convergent lens array 600 arranged at the subsequent stage of a deflection unit 114.

The deflection unit 114 is arranged not near a projection aperture array 115 but near an aperture array 111. The deflection unit 114 includes deflectors 114a which are arranged in correspondence with respective apertures 112 of the aperture array 111. The deflection unit 114 individually deflects charged particle beams which are split by the aperture array 111 and irradiate the projection aperture array 115.

The convergent lens array 600 is formed from, for example, an Einzel electrostatic lens, similar to a projection lens array 121. The convergent lens array 600 has a lens power designed so that the front focal plane position of the convergent lens array 600 coincides with the position of the aperture array 111.

An arrangement after the projection aperture array 115 is the same as that of the drawing apparatus 100A. In the drawing apparatus 100C, the projection lens array 121 reduces and projects apertures 116 of the projection aperture array 115.

Unlike the drawing apparatus 100A, the drawing apparatus 100C uses not apertures 120 of a stop array 119, but the apertures 116 of the projection aperture array 115 as apertures for adjusting the amount of the current of a charged particle beam. The projection aperture array 115 is an aperture array arranged at a position optically conjugate to the imaging plane on which a charged particle beam forms an image (plane on which a substrate 122 is arranged).

Adjustment processing of correcting the dispersion of the amounts of the current of charged particle beams on a substrate in the drawing apparatus 100C, that is, adjusting the amounts of the current of charged particle beams irradiating the substrate 122 will be explained with reference to FIGS. 11A to 11D.

FIG. 11A is a view showing an arrangement from the aperture array 111 to a blanker array 117. Referring to FIG. 11A, the deflection unit 114 deflects only a charged particle beam CP3 out of three charged particle beams CP1, CP2, and CP3. Hence, the irradiated position of the charged particle beam CP3 on the projection aperture array 115 after deflection by the deflection unit 114 shifts from that of the charged particle beam CP3 on the projection aperture array 115 before deflection by the deflection unit 114. Assume that the irradiated position of the charged particle beam CP3 on the projection aperture array 115 before deflection by the deflection unit 114 is adjusted to a position where the amount of the current of the charged particle beam CP3 passing through the aperture 116 of the projection aperture array 115 becomes maximum. In this case, if the deflection unit 114 deflects the charged particle beam CP3, the amount of the current of the charged particle beam CP3 passing through the aperture 116 of the projection aperture array 115 decreases unless the shape of the charged particle beam CP3 with respect to the irradiated position is a perfect rectangle.

FIG. 11B shows the distribution of the amounts of the current of charged particle beams when the irradiated positions on the projection aperture array 115 are adjusted to positions where the amounts of the current of the charged particle beams passing through the apertures 116 become maximum. In FIG. 11C, a solid line represents the distribution of the amounts of the current of charged particle beams when the deflection unit 114 intentionally shifts the irradiated positions of the charged particle beams on the projection aperture array 115 from the state shown in FIG. 11B. Also, in FIG. 11C, a dotted line represents the distribution (that is, distribution shown in FIG. 11B) of the amounts of the current of charged particle beams when the amounts of the current of the charged particle beams passing through the apertures 116 of the projection aperture array 115 become maximum.

Referring to FIGS. 11B and 11C, the amounts of the current of charged particle beams passing through the apertures 116 can be adjusted to a target amount of the current (target intensity) equal to or smaller than a peak amount of the current by changing the irradiated positions of the charged particle beams on the projection aperture array 115 by the deflection unit 114. FIG. 11D shows a state in which the amount of the current of a charged particle beam passing through the aperture 116 of the projection aperture array 115 is adjusted from a peak value of the current I_peak to a target amount of the current I_target by shifting the irradiated position by the deflection unit 114.

As described above, the difference between the drawing apparatuses 100C and 100A is that the projection aperture array 115 is used in place of the stop array 119, as an aperture array for adjusting the amount of the current of a charged particle beam. The drawing apparatus 100C can reduce the dispersion of the amounts of the current of charged particle beams on a substrate by adjusting the amounts of the current of the charged particle beams passing through the apertures 116 of the projection aperture array 115 by the deflection unit 114. Similar to the drawing apparatus 100A, the drawing apparatus 100C can perform drawing processing of drawing a pattern on the substrate 122 while suppressing a decrease in throughput and an increase in cost.

The function of the convergent lens array 600 in the third embodiment will be explained. The convergent lens array 600 is arranged at the subsequent stage of the deflection unit 114 in order to maintain a constant principal ray angle of a charged particle beam even when the deflection unit 114 shifts the irradiated position of the charged particle beam on the projection aperture array 115. As described above, in the third embodiment, the front focal plane position of the convergent lens array 600 almost coincides with the position of the aperture array 111. Even if the deflection unit 114 arranged near the aperture array 111 deflects charged particle beams, the distribution of the charged particle beams on the front focal plane of the convergent lens array 600 does not change. Although the irradiated positions of the charged particle beams on the projection aperture array 115 are shifted, a constant principal ray angle is maintained. This optical arrangement can reduce the influence of deflection of charged particle beams by the deflection unit 114 on an optical system at the subsequent stage.

<Fourth Embodiment>

The drawing apparatuses according to the above-described embodiments, that is, the drawing apparatuses 100A, 100B, and 100C can perform drawing processing while suppressing a decrease in throughput and an increase in cost. The drawing apparatuses according to the above-described embodiments are suitable for manufacturing an article including a microdevice such as a semiconductor device, and an element having a microstructure. The method of manufacturing an article includes a step of forming a latent image pattern on a photosensitive agent applied onto a substrate by using the drawing apparatus according to each of the above-described embodiments (a step of performing drawing on a substrate), and a step of developing the substrate having the latent image pattern formed on it in the forming step (a step of developing the substrate on which the drawing has been performed). This manufacturing method can also include other known steps (for example, oxidation, film formation, vapor deposition, doping, planarization, etching, resist removal, dicing, bonding, and packaging). The method of manufacturing an article according to the embodiment is more advantageous in terms of at least one of the performance, quality, productivity, and manufacturing cost of an article than the conventional method.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-270701 filed Dec. 11, 2012, which is hereby incorporated by reference herein in its entirety.

What is claimed is:

1. A drawing apparatus which performs drawing on a substrate with a plurality of charged particle beams, comprising:
   an aperture array configured to include a plurality of apertures for shaping the respective charged particle beams;
   a first deflection unit configured to include a plurality of first deflectors which are arranged on a side, with respect to the aperture array, of a charged particle source for radiating a charged particle beam and which deflect the respective charged particle beams, and to individually change irradiated positions of the respective charged particle beams on the aperture array by driving the respective first deflectors;
   a second deflection unit configured to be arranged on a different position from the first deflection unit, to include a plurality of second deflectors which deflect the respective charged particle beams, and to perform irradiation or non-irradiation of the substrate with the charged particle beams by driving the respective second deflectors; and
   a controller configured to control the first deflection unit so that a dispersion of amounts of current of the plurality of charged particle beams on the substrate is reduced by deflecting each of at least a part of charged particle beams among the plurality of charged particle beams, with first deflectors corresponding to each of the at least a part of charged particle beams among the plurality of first deflectors, in a direction to which an amount of current of charged particle beam passing through the aperture is decreased.

2. The apparatus according to claim 1, wherein the controller controls deflection of the charged particle beams by the first deflectors to adjust the amounts of current of the respective charged particle beams to be a target amount of current.

3. The apparatus according to claim 2, wherein the controller decides the target amount of current based on a maximum deflection amount of a charged particle beam by the first deflector.

4. The apparatus according to claim 2, further comprising a detector configured to detect the amounts of current of the respective charged particle beams on the substrate, wherein the controller decides the target amount of current based on the amounts of current detected by the detector.

5. The apparatus according to claim 2, wherein the controller decides the target amount of current to maximize a sum of the amounts of current of the respective charged particle beams on the substrate after deflection by the first deflection unit.

6. The apparatus according to claim 2, further comprising a detector configured to detect the amounts of current of the respective charged particle beams on the substrate,
   wherein the controller controls the second deflection unit so that a charged particle beam where a difference between the amounts of current of the respective charged particle beams detected by the detector and the target amount of current falls outside an allowable range is not irradiated on the substrate.

7. The apparatus according to claim 6, wherein the controller decides the allowable range based on at least one of a maximum deflection amount of the charged particle beam by the first deflector or aberration deterioration by deflection control by the first deflection unit.

8. The apparatus according to claim 1, wherein the plurality of first deflectors are arranged within a plane parallel to a plane direction of the aperture array.

9. The apparatus according to claim 1, wherein the aperture array is arranged at a position conjugate to a position of a pupil plane with respect to an imaging plane on which the plurality of charged particle beams form images.

10. The apparatus according to claim 1, wherein the aperture array is arranged at a position conjugate to an imaging plane on which the plurality of charged particle beams form images.

11. The apparatus according to claim 1, wherein a number of first deflectors is smaller than a number of apertures in the aperture array, and the controller collectively controls, by at least one of the first deflectors, deflection of a plurality of particle charged beams which passes through each of the apertures in the aperture array.

12. A method of manufacturing an article, the method comprising:
   performing drawing on a substrate using a drawing apparatus; and
   developing the substrate on which the drawing has been performed,
   wherein the drawing apparatus performs drawing on the substrate with a plurality of charged particle beams, and includes:

an aperture array configured to include a plurality of apertures for shaping the respective charged particle beams;

a first deflection unit configured to include a plurality of first deflectors which are arranged on a side, with respect to the aperture array, of a charged particle source for radiating a charged particle beam and which deflect the respective charged particle beams, and to individually change irradiated positions of the respective charged particle beams on the aperture array by driving the respective first deflectors;

a second deflection unit configured to be arranged on a different position from the first deflection unit, to include a plurality of second deflectors which deflect the respective charged particle beams, and to perform irradiation or non-irradiation of the substrate with the charged particle beams by driving the respective second deflectors; and a controller configured to control the first deflection unit so that a dispersion of amounts of current of the plurality of charged particle beams on the substrate is reduced by deflecting each of at least a part of charged particle beams among the plurality of charged particle beams, with first deflectors corresponding to each of the at least a part of charged particle beams among the plurality of first deflectors, in a direction to which an amount of current of charged particle beam passing through the aperture is decreased.

13. The apparatus according to claim 1, wherein the first deflection unit is a non-blanking deflection unit.

14. The apparatus according to claim 1, wherein the controller supplies, as deflection signal, signal having three or more values to the respective first deflectors, and supplies, as deflection signal, binary signal to the respective second deflectors.

15. The apparatus according to claim 1, wherein the controller supplies, as deflection signal, analog signal to the respective first deflectors, and supplies, as deflection signal, binary signal to the respective second deflectors.

16. A drawing apparatus which performs drawing on a substrate with a plurality of charged particle beams, comprising:

an aperture array configured to include a plurality of apertures for shaping the respective charged particle beams;

a first deflection unit configured to include a plurality of first deflectors which are arranged on a side, with respect to the aperture array, of a charged particle source for radiating a charged particle beam and which deflect the respective charged particle beams for each group, and to individually change irradiated positions of the respective charged particle beams for the each group on the aperture array by driving the respective first deflectors;

a second deflection unit configured to be arranged on a different position from the first deflection unit, to include a plurality of second deflectors which deflect the respective charged particle beams, and to perform irradiation or non-irradiation of the substrate with the charged particle beams by driving the respective second deflectors; and a controller configured to control the first deflection unit so that a dispersion of amounts of the plurality of charged particle beams on the substrate is reduced by deflecting at least a part of charged particle beams among the plurality of charged particle beams for each group, with first deflectors corresponding to the each group, in a direction to which an amount of current of charged particle beam passing through the aperture is decreased.

* * * * *